United States Patent [19]
Talbot et al.

[11] Patent Number: 6,091,249
[45] Date of Patent: Jul. 18, 2000

[54] METHOD AND APPARATUS FOR DETECTING DEFECTS IN WAFERS

[75] Inventors: Christopher Graham Talbot, Redwood City; Chiwoei Wayne Lo, Campbell; Luis Camilo Orjuela; Li Wang, both of San Jose, all of Calif.

[73] Assignee: Schlumberger Technologies, Inc., San Jose, Calif.

[21] Appl. No.: 09/012,277

[22] Filed: Jan. 23, 1998

Related U.S. Application Data

[63] Continuation-in-part of application No. 08/782,740, Jan. 13, 1997, abandoned.

[51] Int. Cl.$^7$ .......................... G01R 31/305; G01R 31/02
[52] U.S. Cl. .......................... 324/751; 324/750; 324/754; 324/765
[58] Field of Search .................................. 324/452, 456, 324/501, 537, 750, 751, 754, 765

[56] References Cited

U.S. PATENT DOCUMENTS

| | | | |
|---|---|---|---|
| 4,347,001 | 8/1982 | Levy et al. | 356/398 |
| 4,378,159 | 3/1983 | Galbraith | 356/237 |
| 4,415,851 | 11/1983 | Langner et al. | 324/51 |
| 4,417,203 | 11/1983 | Pfeiffer et al. | 324/51 |
| 4,443,278 | 4/1984 | Zingher | 156/64 |
| 4,755,748 | 7/1988 | Lin | 324/158 R |
| 4,755,874 | 7/1988 | Esrig et al. | 358/106 |
| 4,766,324 | 8/1988 | Saadat et al. | 250/563 |
| 4,845,558 | 7/1989 | Tsai et al. | 358/106 |
| 4,898,471 | 2/1990 | Stonestrom et al. | 356/394 |
| 5,030,008 | 7/1991 | Scott et al. | 356/394 |
| 5,131,755 | 7/1992 | Chadwick et al. | 356/394 |
| 5,264,912 | 11/1993 | Vaught et al. | 356/237 |
| 5,276,498 | 1/1994 | Galbraith | 356/237 |
| 5,355,212 | 10/1994 | Wells et al. | 356/237 |
| 5,416,594 | 5/1995 | Gross et al. | 356/237 |
| 5,438,413 | 8/1995 | Mazor et al. | 356/363 |
| 5,521,516 | 5/1996 | Hanagama et al. | 324/751 |
| 5,578,821 | 11/1996 | Meisberger et al. | 250/310 |
| 5,804,980 | 9/1998 | Nikawa | 324/752 |
| 5,821,761 | 10/1998 | Shida et al. | 324/751 |

FOREIGN PATENT DOCUMENTS

| | | |
|---|---|---|
| 0 624 787 A1 | 11/1994 | European Pat. Off. . |
| 61-88294 | 7/1994 | Japan . |

OTHER PUBLICATIONS

Thomas R. Cass, *Use of the Voltage Contrast Effect for the Automatic Detection of Electrical Defects on In–Process Wafers*, SEMSpec Advanced Wafer Inspection, KLA Instruments Corporation, Santa Clara, Calif. (date unavailable).

*Primary Examiner*—Glenn W. Brown
*Attorney, Agent, or Firm*—Bruce D. Riter; Danita J.M. Maseles

[57] ABSTRACT

A method for detecting electrical defects in a semiconductor wafer, includes the steps of: a) applying charge to the wafer such that electrically isolated structures are raised to a voltage relative to electrically grounded structures; b) obtaining voltage contrast data for at least a portion of the wafer containing such structures using an electron beam; and c) analyzing the voltage contrast data to detect structures at voltages different from predetermined voltages for such structures. Voltage contrast data can take one of a number of forms. In a simple form, data for a number of positions on a line scan of an electron beam can be taken and displayed or stored as a series of voltage levels and scan positions. Alternatively, the data from a series of scans can be displayed as a voltage contrast image. Analysis can be achieved by comparison of one set of voltage contrast data, for example voltage contrast data from one die on a wafer, with one or more other such sets, for example voltage contrast data for corresponding structures on one or more preceding dice, so as to determine differences therebetween.

42 Claims, 13 Drawing Sheets

PLAN A FOR
SPHERICAL ELECTRODES

PLAN A FOR
CYLINDRICAL ELECTRODES

BEAM BEFORE THE APERTURE

BEAM SHAPED BY THE APERTURE

METHOD AND APPARATUS FOR DETECTING DEFECTS IN WAFERS

This application is a continuation-in-part of U.S. application Ser. No. 08/782,740, filed Jan. 13, 1997, now abandoned.

The present invention relates to methods and apparatus for use in detecting defects in dies formed on wafers used in the manufacture of semiconductor integrated circuits. In particular, the invention provides a means by which such wafers can be inspected using an electron beam device during the manufacturing process so as to detect defects in the dies which would not otherwise be visible in conventional inspection procedures and which would affect the performance of integrated circuit devices made from those dies.

BACKGROUND OF THE INVENTION

The process of production of semiconductors includes processing of a circular silicon wafer typically 8" in diameter. The processing includes repetition of series of steps: oxidation and deposition; lithography; etching; and doping (implanting and diffusing). Depending on the maturity of the production process used, the wafer might be inspected for particles/production defects, mask alignment and critical dimension metrology between the processing steps. The frequency of inspection can be as often as every wafer in the development phase of a process, or on wafers from alternate production lots from mature processes.

Particle (production defect) detection detects either the presence of contaminant particles introduced in the manufacturing process, or areas where processing has been defective so as to produce unwanted features in the structures of the device. Current methods of particle detection, such as those provided by Tencor Instruments or KLA Instruments, involve obtaining topological information from the surface of the wafer using optical techniques as described in U.S. Pat. Nos. 4,347,001; 4,378,159; 4,755,874; 4,766,324; 4,845,558; 4,898,471; 5,030,008; 5,131,755; 5,264,912; 5,276,498; 5,355,212; 5,416,594,5,438,413 and European Patent Application 624787A, or topographical imaging scanning electron microscope techniques, such as the KLA SEMSpec system or those techniques described in JP 61 88294

These current techniques make no distinction between defects (particles) which will affect the operation of the completed integrated circuit (IC), which are known as "killer" defects, and those which have no detrimental effect, known as "nuisance" defects. Since nuisance defects can account for 90% of detected defects, some form of review is required to ensure that wafers which would otherwise produce acceptable yields of operational ICs are not rejected. This review is currently a manual operation. Defects are classified by inspection of an image of the wafer including the defect identified by the inspection system. Review is typically performed on optical or scanning electron microscope (SEM) review stations. Operators classify and tabulate defects based on prior experience and defect location. Relatively slow, manual, defect classification is the only current way to reduce the number of nuisance defects affecting wafer yields. This process still gives no direct information as to whether a defect will affect the performance of a completed device.

These methods also suffer from the problem that they cannot detect defects which are invisible from the surface, be they nuisance or killer. Invisible killer defects include problems such as open vias, incomplete via holes and gate oxide integrity problems. All of these can result in an inoperative device but are undetectable with present in-line defect detection systems. Furthermore, as the geometries of semiconductors become smaller, optical techniques become less useful due to accuracy being limited by the optical diffraction limit of resolution. It is believed that for 0.25 $\mu$m geometry integrated circuits, less than 50% of killer defects commonly encountered in a semiconductor manufacturing process are observable using optical techniques, even when operating in the short wavelength UV range. Optical techniques also operate less successfully after chemical mechanical polishing steps due to the formation of a planar surface which means that defects are less likely to scatter light, a key factor in some optical defect detection methods.

SEM-based inspection systems have been proposed using die-to-die comparison methods. Such systems are optimized to obtain topographical information. Known techniques have small pixel size (0.1 $\mu$m) and consequently very long inspection times, of the order of 10 to 80 hours for a complete wafer. This, combined with a high incidence of nuisance defect detection makes such techniques undesirable for production uses. Topographical data also does not reveal hidden defects and so suffers from the drawbacks of optical methods. It has been previously proposed to use an electron beam prober to obtain voltage contrast images of wafers. However, these techniques are slow since they require the electron beam to be scanned over the wafer several times before a good image can be obtained.

SEMs, and electron beam probers, a variant of the SEM well known for functional probing of structures in integrated circuit devices, are also often used to obtain voltage contrast images of devices. In a voltage contrast image, the voltage of a structure being imaged determines the brightness of that structure in the image. This is achieved by using a filter electrode grid to control the detection of secondary electrons depending on their energy so as to enhance the voltage contrast. Such an approach has been used to image test structures formed in the wafer as an indicator of the reliability of the manufacturing process.

SEMs have been used to detect invisible faults in the part-finished multi-chip module substrates (MCMs) and examples of these techniques are found in U.S. Pat. No. 4,415,851, U.S. Pat. No. 4,417,203 and U.S. Pat. No. 4,443,278. These patents describe a technique in which a 2 keV electron flood gun is used to apply charge to the conductive nets of an MCM substrates, the nodes of which are then examined using an electron beam probe which is vectored from node to node to measure the voltage present at the nodes and discharge the nets. The voltage measurements are used to indicate the presence of faults in the nets. The MCMs examined with this technique are intended to locate and connect a number of completed IC devices. Similar techniques using higher and lower energy flood guns to pre-charge the conductors have been applied to MCMs It is an object of the present invention to provide a system suitable for inspecting semiconductor wafers which does not suffer from the deficiencies of known optical systems outlined above and which is capable of revealing hidden defects.

SUMMARY OF THE INVENTION

In accordance with one aspect of the present invention, there is provided a method for detecting electrical defects in a semiconductor wafer, comprising: a) applying charge to the wafer such that electrically isolated structures are raised to a voltage relative to electrically grounded structures; b) obtaining voltage contrast data for at least a portion of the wafer containing such structures using an electron beam; and c) analyzing the voltage contrast data to detect structures at a voltages different to predetermined voltages for such structures.

The application of charge is typically achieved by flooding the wafer with relatively low energy (~1 keV) electrons. Conducting structures in the wafer which are floating will hold such charge and remain at an elevated voltage compared to grounded structures in the wafer. The voltage contrast image will differentiate between such structures. The acquisition of a voltage contrast image from an electron beam or SEM device is readily accomplished. A beam of electrons is scanned over the wafer and secondary electrons ejected from the wafer are detected. The number of electrons detected for a given position on the wafer indicates the voltage of the structure at that point. Optimization of the contrast between relatively high and ground voltage structures is achieved by appropriate selection of the energy of the flooding electrons and by setting a filter grid voltage to enhance the detection of electrons of predetermined energies at the detector. The term "flooding" here is used to indicate that electrons (or other charged particles) are applied to the wafer in a relatively diffuse beam rather than a high resolution such as is used in probing. The flooding spot size and beam current might be a few orders of magnitude larger than a spot size used to obtain voltage contrast data. Flooding can be achieved using one or more flooding sources in addition to the probing source. Alternatively, the same source could be used for both with an adjustment of beam spot size and beam current depending on which function is to be performed.

Voltage contrast data can take one of a number of forms. In a simple form, data for a number of positions on a line scan of an electron beam can be taken and displayed or stored as a series of voltage levels and scan positions. Therefore in another aspect, the present invention provides a method of detecting electrical defects in a device on a semiconductor wafer, the device having some structures at ground voltage and other structures at a floating voltage relative to ground, the method comprising: a) scanning an electron beam across the surface of the device in a series of spaced scan lines; b) obtaining voltage contrast data for each scan line in the series; and c) analyzing the voltage contrast data from the scan lines to determine the presence of a structure at a different voltage to a predetermined voltage for that structure.

The manner in which the electron beam is scanned over the wafer can be optimized to acquire sufficient data for reliable determination of voltage levels while not scanning every part of the wafer surface. Such optimization attempts to ensure that structures are examined at sufficient detail to detect all functional failures due to killer defects while reducing the number of scan lines required to do this, hence reducing the time to inspect a die. In its simplest form this optimization might comprise scanning lines across the die at regular spacings. This however does not ensure that all structures will be examined. Other approaches include scanning across the ends of each conductive trace in the die, the position of these being determined from design data or a reference die. Because some deflection of the beam is possible during scanning, it is possible that these ends need not be in an absolutely linear arrangement at the scale of the beam (0.2 $\mu$m) but might lie in a wider window of, for example, 1 $\mu$m. Since the beam only normally scans in one direction while structures typically lie at right angles to each other, it may be necessary to scan the wafer first in one orientation and again after rotation through 90° in order to obtain the necessary voltage contrast data. Another technique is to scan the beam in a direction which is orthogonal to the structure axes on the wafer or the axes of a stage carrying the wafer. The number and operation of these scan lines can be determined by analysis of design data.

An alternative approach is to display voltage contrast data as a voltage contrast image. The voltage contrast image or line scan data can be analyzed to identify structures which are at a higher or lower voltage than is to be expected, i.e. structures which are isolated or grounded due to defects. Analysis can be achieved by comparison of one set of voltage contrast data, for example voltage contrast data from one die on a wafer, with one or more other such sets, for example voltage contrast data for corresponding structures on one or more preceding dice, so as to determine differences therebetween. Such comparison is similarly used in optical techniques to detect the presence of particles in optical images. Another technique would be to compare voltage contrast data with the expected electrical performance of the structures derived from design data.

Detecting floating and grounded conductors in this manner provides a reliable, non-contact means of finding killer defects. It is possible that measurement at only one location on a structure will be sufficient to identify whether that structure is at a voltage different to what would be expected from a known correct wafer. During conductor formation steps in the semiconductor manufacturing process (typically 1–3 polysilicon levels and 2–6 metal layers), some conductors are electrically isolated (floating) from the substrate and some are electrically connected (grounded) to the substrate. For example, during charging of the wafer and scanning with an electron beam, floating conductors charge to a small, positive voltage and, when detecting secondary electrons with a detection setup optimized to produce a voltage contrast image (rather than topography or materials contrast), these will appear dull whereas conductors which are grounded through the substrate will not charge and will appear bright in the same image and insulators will appear as a dark background.

DESCRIPTION OF THE PREFERRED EMBODIMENT

Figure 1:
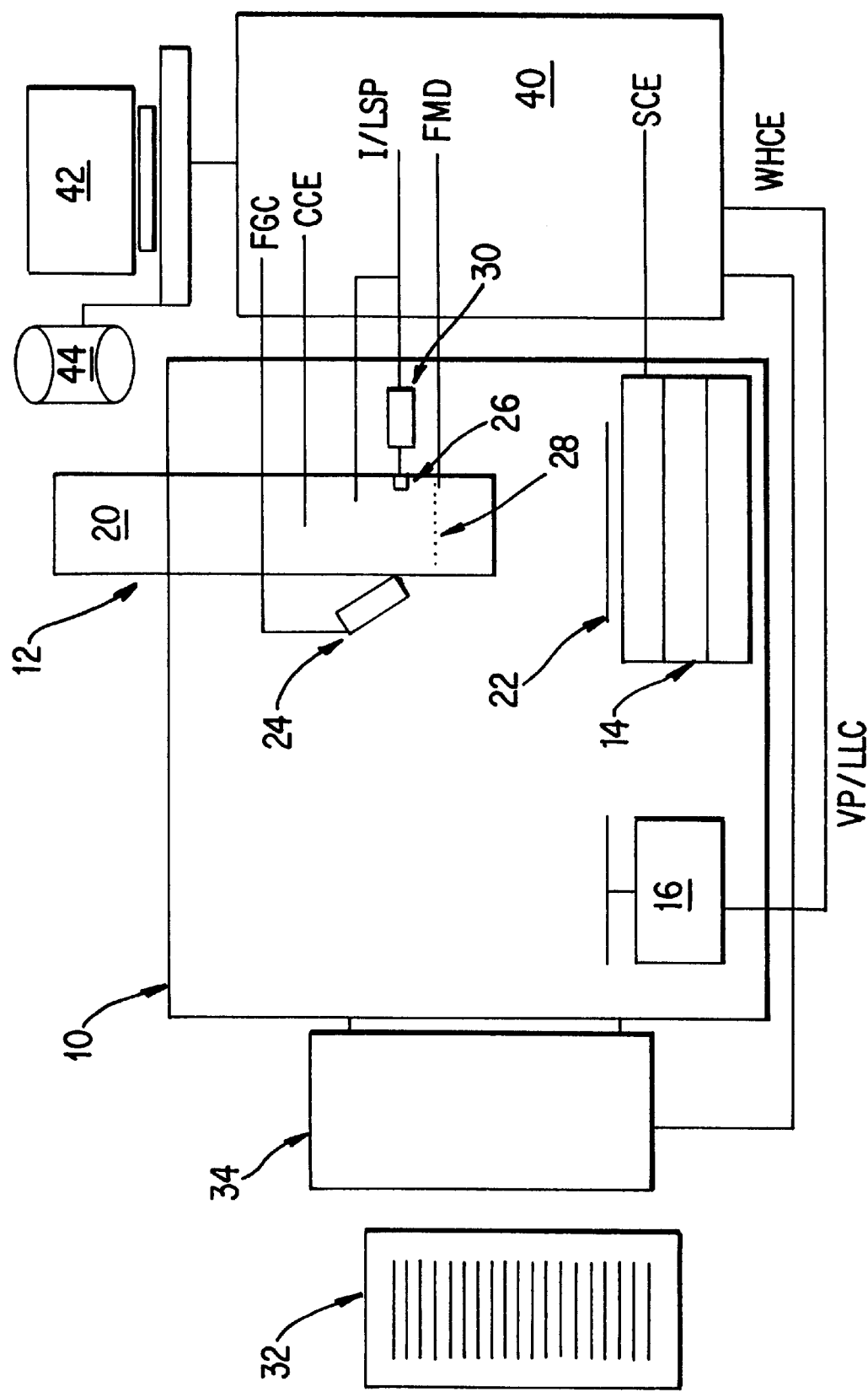
FIG. 1 shows a schematic view of a system for detecting wafer defects in accordance with the invention.

Referring now to FIG. 1, a system according to the present invention comprises a vacuum chamber 10 housing an electron beam device 12, a stage 14, and a wafer handling robot 16. The electron beam device 12 comprises a scanning electron microscope column 20, such as is used in IC e-beam probing devices such as the IDS 10000 available from Schlumberger Technologies, Inc. Automatic Test Equipment division of San Jose, Cali. The column 20 is positioned above the stage 14 which is capable of supporting a semiconductor IC manufacturing wafer 22 and allows movement in two directions (an X-Y stage). The stage 14 is arranged such that any part of the wafer 22 can be brought within the field of view of the column 20. A low energy (~1 keV) electron source 24 is inserted from the side of the column and arranged to flood the wafer 22 in the field of view of the column 20 with electrons. A secondary electron detector 26 is provided to detect secondary electrons emitted from the surface of the wafer 22 when the electron beam is scanned over it. In order to optimize the ability of the detector 26 to detect voltage contrast between floating and grounded structures in the wafer, a biased filter mesh 28 is provided between the wafer 22 and the detector 26, the mesh 28 being held at a bias voltage such that only electrons with higher than a predetermined energy will pass to the detector 26 and be detected. The response of the detector is enhanced by a photomultiplier tube 30.

The wafer 22 is positioned on the stage 14 by means of the handler robot 16 which can be located within the chamber 10 as shown or outside the chamber as appropraite. Such robots are common in semiconductor manufacturing processes. In order to be accessible to the robot 16, a cassette of wafers 32 is loaded into a load lock 34 which can then be sealed and lowered to the pressure of the chamber 10. This reduces the need to bring the chamber up to atmospheric pressure each time a new cassette of wafers is inserted. A control system 40, itself operated under control from a computer 42 including a database 44 of CAD design data and optimized line scan recipes, controls operation of this system. The control system includes column control electronics CCE, image/line scan processor I/LSP, filter mesh drive FMD, stage control electronics SCE, wafer handler control electronics WHCE, vacuum pump and load lock controls VP/LLC and flood gun controls FGC.

Figure 2:
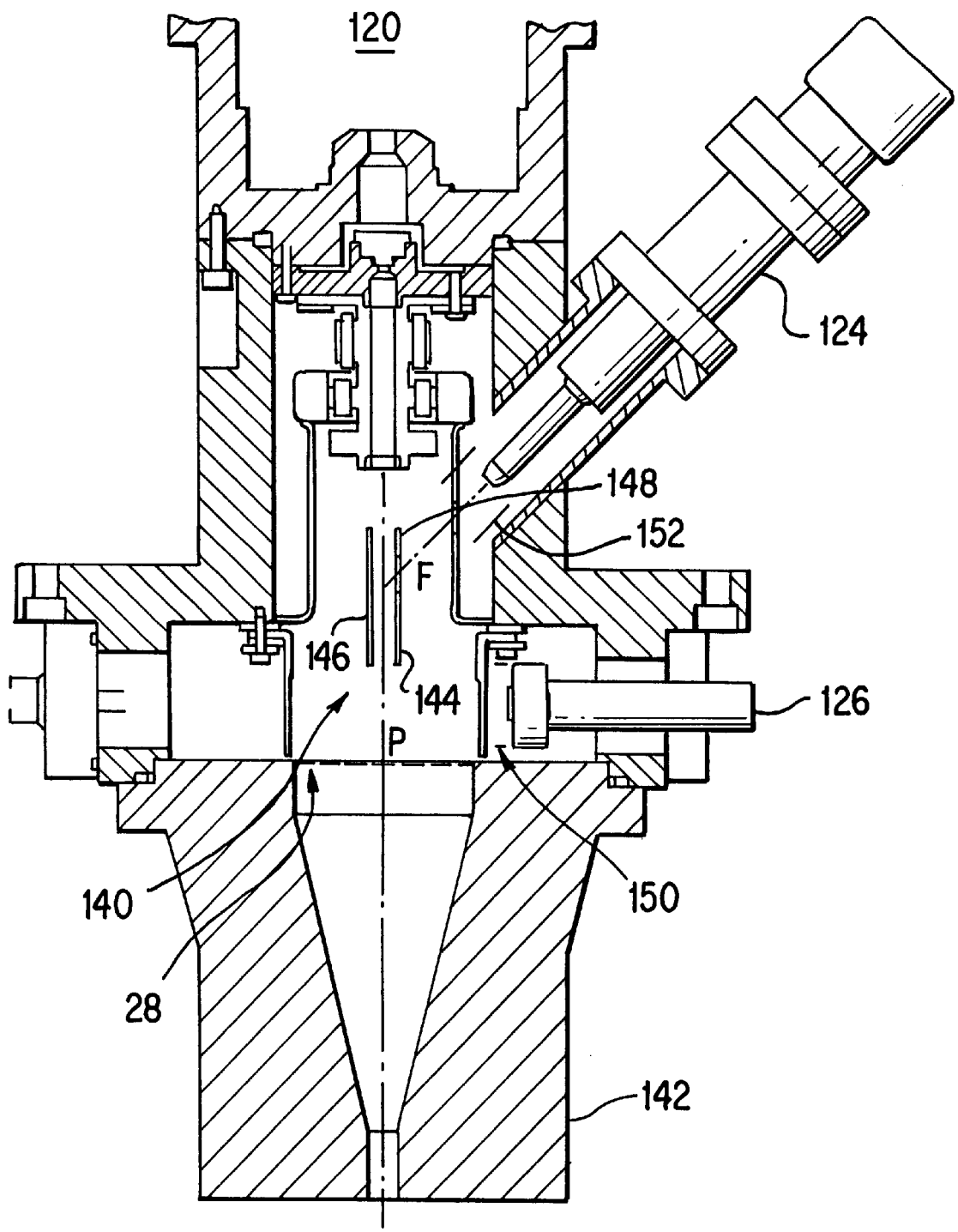
FIG. 2 shows a detailed view of the flood gun, secondary electron detector and objective end of an electron beam column suitable for use in the arrangement of FIG. 1.

A more detailed view of an arrangement of the flood gun 24 and detector 26 at the objective end of the column 20 is shown in FIG. 2. In this case, a suitable flood gun 124, such as a Kimball Physics ELG5, is positioned to one side of the column 120 and arranged to project a flooding beam F into the primary beam P of the column via deflector 140 positioned in the beam P above the objective lens 142. The deflector 140 comprises a pair of parallel plates 144, 146. The plate 144 closest to the flood gun 126 has an aperture 148 through which the flooding beam F can pass and is held at ground potential. The other plate 146 is held at a sufficiently high voltage to deflect the flooding beam F along the path of the primary beam P and onto the wafer. The secondary electron detector 126 is located to one side of the column and is protected by an electrode structure 150 held at a few tens of volts (e.g. 50–100 V) in most electron flooding situations. The application of the flooding beam can be turned on and off by use of a similar electrode structure 152 adjacent the end of the flood gun 124 or by use of an internal electrode near the electron source (not shown).

The flood gun is operated to provide a beam of relatively low energy electrons. The upper limit of the energy range is usually considered to be about 1.5 keV (above this energy the devices are potentially damaged by Bremstrahlung radiation from aluminum or unregulated negative charging). It is considered desirable to work in an energy range for which the yield of secondary electrons is greater than 1 (energy is between the two "crossovers"). It si generally believed to be in the range of 600 eV to 1.5 keV for most materials in semiconductor wafers, the exact range depending on the substrate materials and the stage of fabrication of the wafer. The spot size of the flood gun at the wafer is typically adjustable in the range 50 $\mu$m to 500 $\mu$m. Beam currents are adjustable in the range of 1 nA to 30 $\mu$A. The spot size and beam current are both adjusted to provide the desired current density to obtain a measurable voltage contrast (a few volts, typically less than 1 V) in the area of interest of the wafer.

Figure 3A:
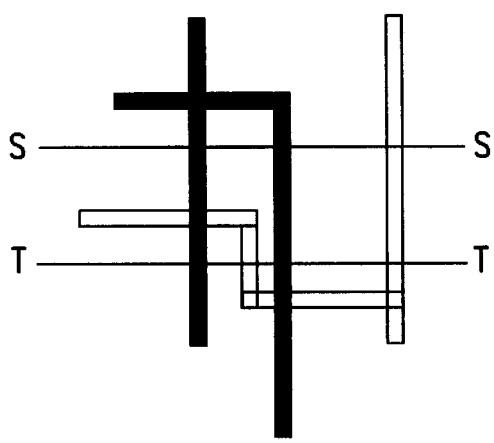
FIGS. 3(a)–3(d) show schematic voltage contrast images of a section of IC with different defects.
Figure 3B:
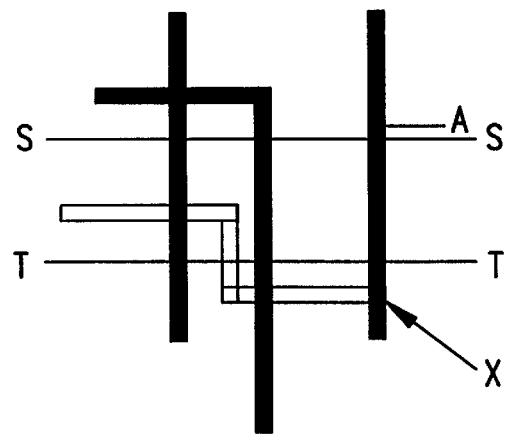
Figure 3C:
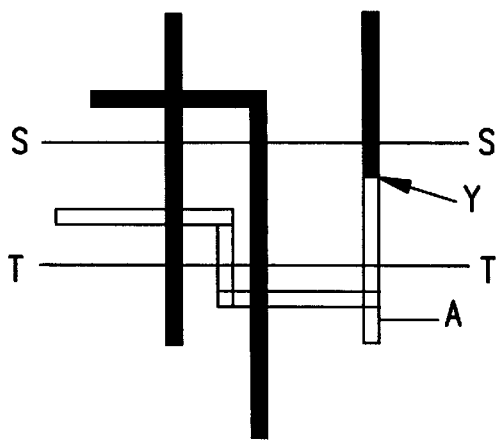
Figure 3D:
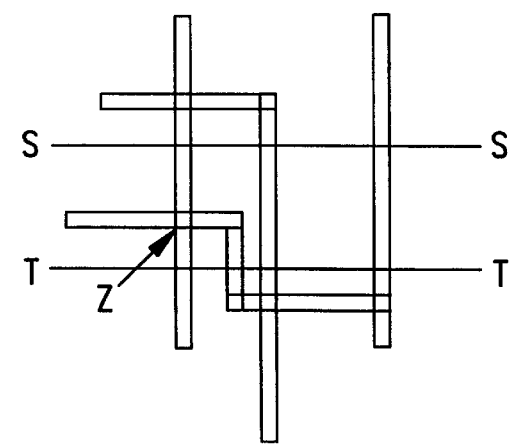
Figure 4A:
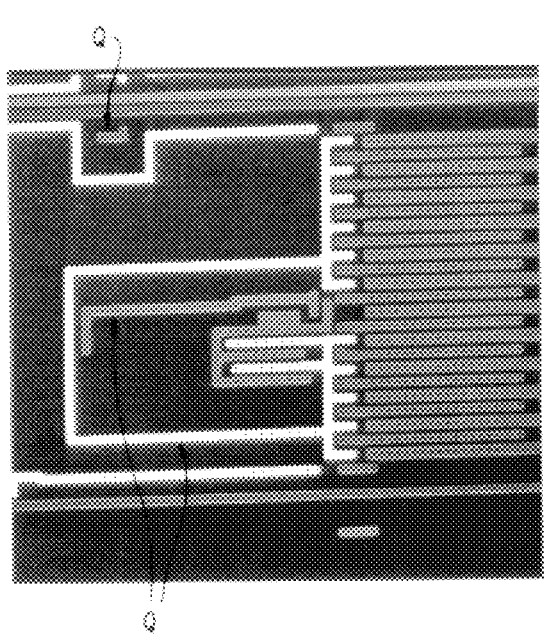
FIGS. 4(a) and (b) show SEM micrographs of a section of an IC with and without a defect.
Figure 4B:
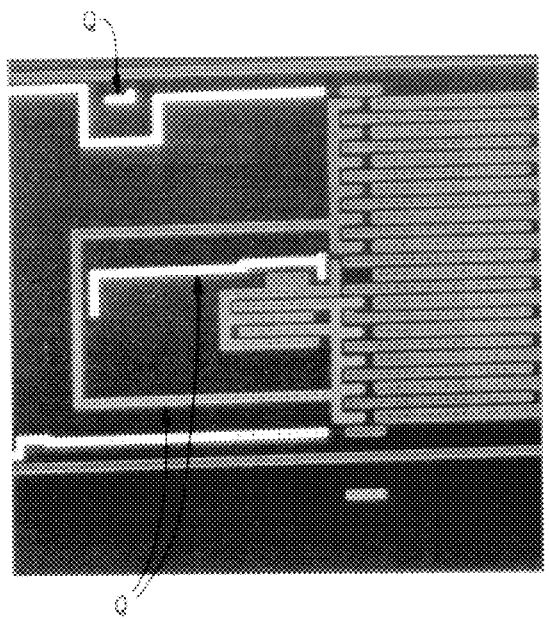

FIGS. 3($a$)–3($d$) show schematically a voltage contrast view of a section of an IC wafer having structures which are floating (dark) or grounded (light). FIG. 3($a$) shows the correct arrangement. FIG. 3($b$) shows how the vc image would appear with a bad via at position X. This defect, invisible to an optical image, results in structure A floating relative to ground. FIG. 3($c$) shows the effect of a broken line in structure A. While the structure A is electrically connected to the other grounded structures correctly, the break in the line will allow the portion beyond position Y to float relative to ground. FIG. 3($d$) shows the effect of an electrical short at position Z which connects the intended floating structures electrically to the grounded structures. FIGS. 4($a$) and 4($b$) show SEM derived voltage contrast images of corresponding portions of memory devices which are intended to be identical. A defect in one of the devices means that structures Q appear as grounded in FIG. 4($a$) and floating in FIG. 4($b$). It is to be noted that, in the absence of any other information, it is not possible to determine which image contains the error. This can be determined by comparison of the images with the corresponding image of a known, defect-free device, or acquisition of one or more corresponding images from other devices and the application of defect detection algorithms similar to those used in optical defect detection can provide the required information. Alternatively, analysis of the CAD data for this structure would be able to tell whether structures Q should be floating or grounded at this stage of manufacture.

Figure 5:
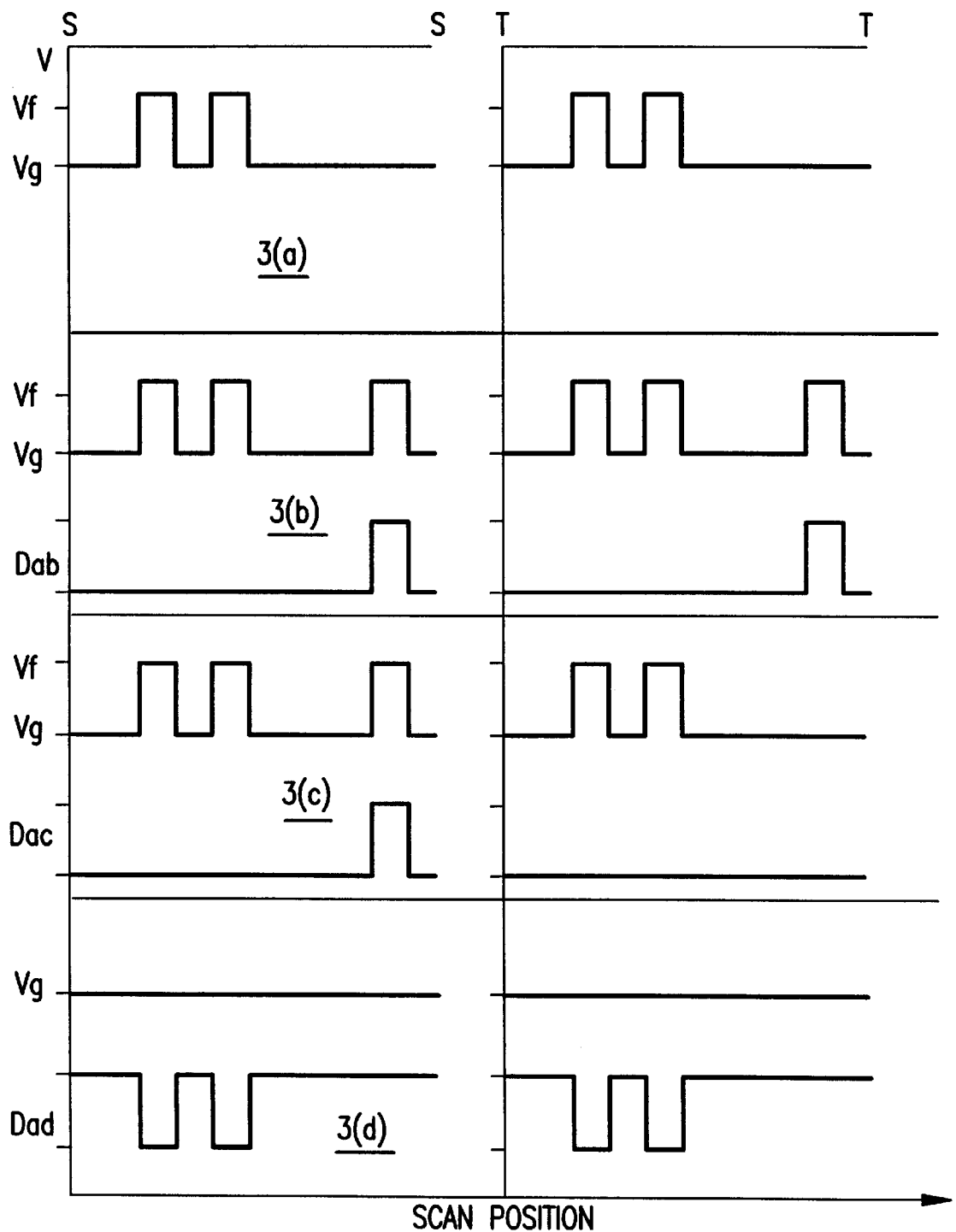
FIG. 5 shows line scan data which would be obtained from the structures in FIGS. 3(a)–(d)

In another preferred embodiment of the invention, presence of a defect can also be located by analysis of line-scan data rather than a voltage contrast image. This is shown in FIG. 5. Scanning the electron beam along lines SS or TT of FIGS. 3(a)–3(d) will produce the voltage contrast data (grounded voltage Vg or floating Voltage Vf) shown in FIG. 5 vs. position on the scan line. After obtaining the difference between a signal from an unknown device (b, c or d) and the signal from a known device (a), any residual signal (Dab, Dac, Dad) is indicative of an error. It is to be noted that scan line TT in for FIG. 3(c) shows no residual signal (Dac) after subtraction, so the defect would not normally be detected. However, scan line SS does result in a residual (Dac) which indicates the defect. From this it will be appreciated that it is not necessary to obtain a complete image for the present invention to allow defects to be detected since the method relies on the electrical behavior of the device rather than its appearance as has been the case in previous optical methods. Use of design data allows determination of which scan lines cross the same structures and so can be compared to determine continuity.

In the line scanning approach, the electron beam is scanned repeatedly across a die in one direction (Y direction) while the wafer is moving in the perpendicular (X) direction on the stage. Thus a die is scanned at typically 1/10th of the frequency that would be used to obtain an image, i.e. the scan lines are ten time further apart than the imaging lines. This means that the number of scans per die is reduced by a factor of 10 so reducing the throughput time by a corresponding factor. It is usually more convenient to move the wafer in one direction until all of the dice aligned in that direction have been scanned and then move one die position across to the next row of dice while the direction of stage movement is reversed. In most cases, each die will be scanned using multiple fields of view of the beam, i.e. only a part of the die (the "field of view") will be pre-charged at any one time, then scanned, then another part pre-charged and scanned and so on until the die is complete. This technique can be used to avoid problems with charge dissipating before the scanning of the die is complete.

It will be appreciated that the total time required to scan any one field of view is dependent on the pre-charging time and the scanning time. Since the pre-charging approach described here is much more efficient at depositing charge on the die, and since the scanning lines are spaced apart, the time required to obtain voltage contrast data can be much shorter than the prior art approaches which use the scanning beam to apply charge and then obtain images for analysis. For the embodiment described above, an improvement in throughput by a factor of 100 can be expected over some prior art systems.

A suitable sequence for detecting wafer defects according to the present invention is as follows:

Setup

1 Load wafer through load lock onto stage below column and align on stage;

-continued

2 Setup electron beam: focus, determine astigmatic variation, prepare focus map, align primary beam and flood beam by comparison of SEM images generated by both;
3 Align/register electron beam with wafer;
4 Retrieve computer file of optimized scan line pattern for wafer from database.

Operation

1 Start stage motion (X direction);
2 Pre-charge first field of view in first die for ~1 ms using flood gun;
3 Interrogate first field of view with electron beam (scan die in Y direction);
4 Store voltage contrast data for first field of view;
5 Pre-charge next field of view in X direction;
6 Interrogate next field of view with electron beam;
7 Store voltage contrast data for next field of view;
8 Repeat steps 5 to 7 until first die is complete and voltage contrast data stored;
9 Repeat steps 2 to 8 for next die in X direction;
10 Align and compare voltage contrast data for next die with that from preceding die or dice and determine differences;
11 Record location of differences in wafer defect map file;
12 Monitor alignment and beam focus;
13 Repeat steps 2 to 12 until last die reached on wafer;
14 Flag if number of defects recorded exceeds a predetermined maximum number for that wafer;
15 Review each defective net at higher magnification voltage contrast image and compare to reference image and store for operator review;
16 Next wafer.

Various alternatives to the arrangement described above can be made while staying within the scope of the invention. For example, the die conductors can be pre-charged with the electron beam which is then used to obtain the voltage contrast data, i.e. the same electron beam is used for pre-charging and probing. However, this approach has the disadvantage that the improved throughput which would otherwise be available by the line scanning approach is not available because the electron beam is not optimized to charge the conductors and so will take much longer to do so than the flood gun described above. Another alternative is to use more than one flood gun.

The sequence of operation outlined above can be changed to include pre-charging of a whole die followed by a complete scanning operation for that die. The particular sequence chosen can be optimized to enhance throughput of the system as a whole while taking into consideration such factors as charge dissipation from the die and consequent degradation of the voltage contrast data.

Another variation is to store all of the voltage contrast data in a database and perform the comparison and/or analysis once all of the data has been collected for a particular wafer, possibly using another computer.

Still further embodiments and features of the invention will now be described with reference to the drawing figures.

Figure 6:
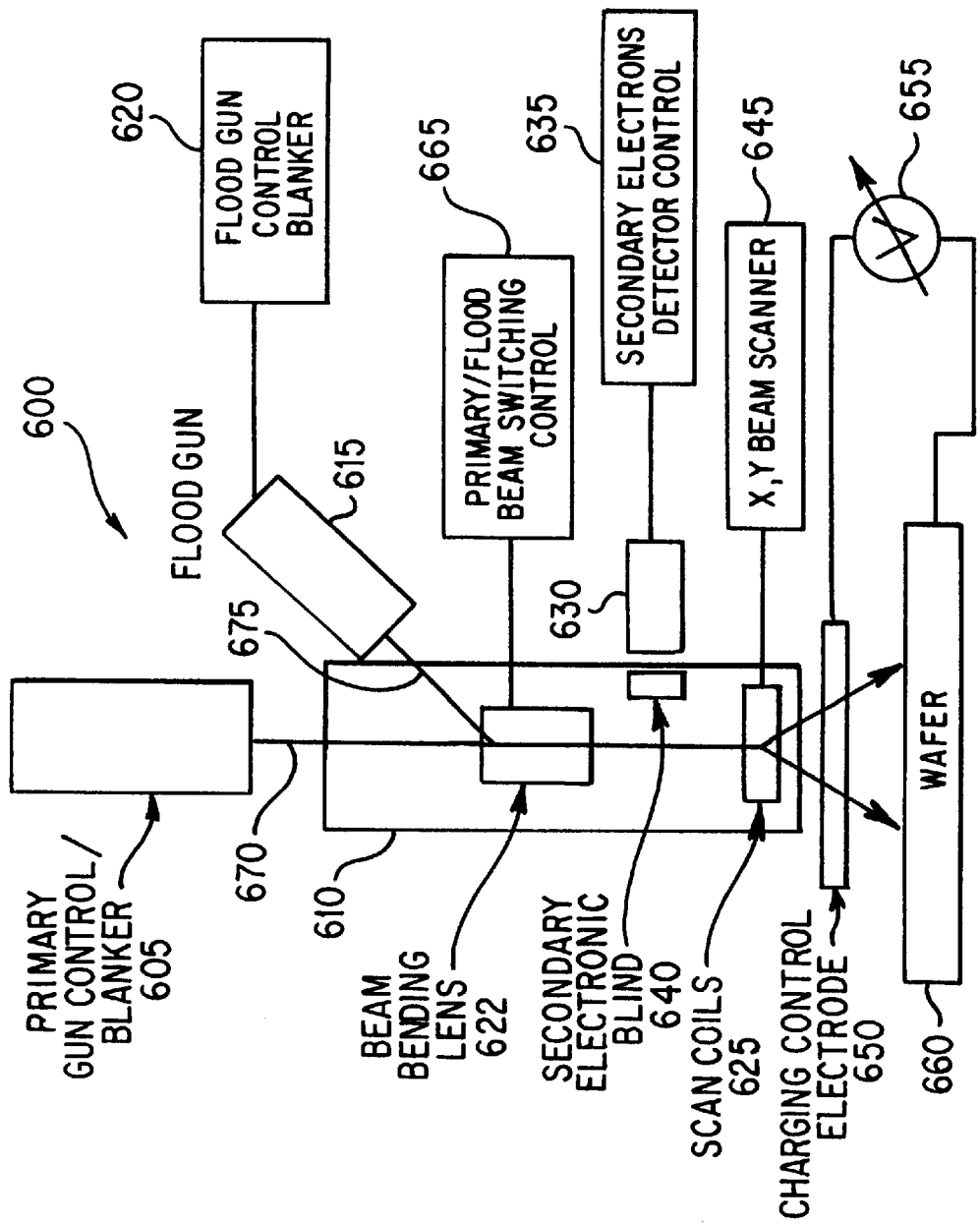
FIG. 6 shows a further schematic view of a system for detecting wafer defects in accordance with the invention.

FIG. 6 shows a further schematic view of a system 600 for detecting wafer defects in accordance with the invention. The diagram is simplified to show principal elements of the system: a primary electron gun 605 having a control system and blanker (not illustrated), an electron column 610, a flood gun 615 having a control system and blanker 620, a beam bending lens 622, raster scan coils (or electrostatic deflectors) 625, a secondary-electron detector 630, secondary electron detector electronics and control 635, a secondary-electron blind 640 (such as electrode structure 150 of FIG. 2 to protect the detector during electron flooding) with control system (not illustrated), a scanning control system 645, a charging control electrode 650, a voltage source 655 for maintaining charging control electrode 650 at a desired voltage relative to a wafer 660 to be inspected, and a primary/flood beam switching control 665 for controlling the beam bending lens.

Beam-bending lens 622 is used to selectively align either the primary beam or the flood beam to the optical axis of the objective lens (not shown in FIG. 6) of beam column 610. The primary gun blanker is used to blank (turn off) the primary beam when not needed and to unblank (turn on) the primary beam when needed. The flood gun blanker 620 is used to blank (turn off) the flood beam when not needed and to unblank (turn on) the flood beam when needed. Voltage is applied to secondary-electron blind 640 so as to repel secondary electrons and prevent them from entering detector 630 during flooding. The scan coils normally used for raster deflection of the primary beam 670 can also be used to deflect flood beam 675 so that a sufficient flood area can be covered. As discussed in more detail in one of the embodiments below, depending on the location of the flood-gun-optics cross-over point, the flood-beam size can be highly de-magnified to obtain a small flood-beam spot. If the flood-beam spot is smaller than the area to be covered by flooding, the flood beam is rastered using scan coils 625 to cover the desired area. Another reason for mastering the flood beam is to achieve flooding uniformity over a large area, so that uniformity is independent of beam profile.

Figure 7:
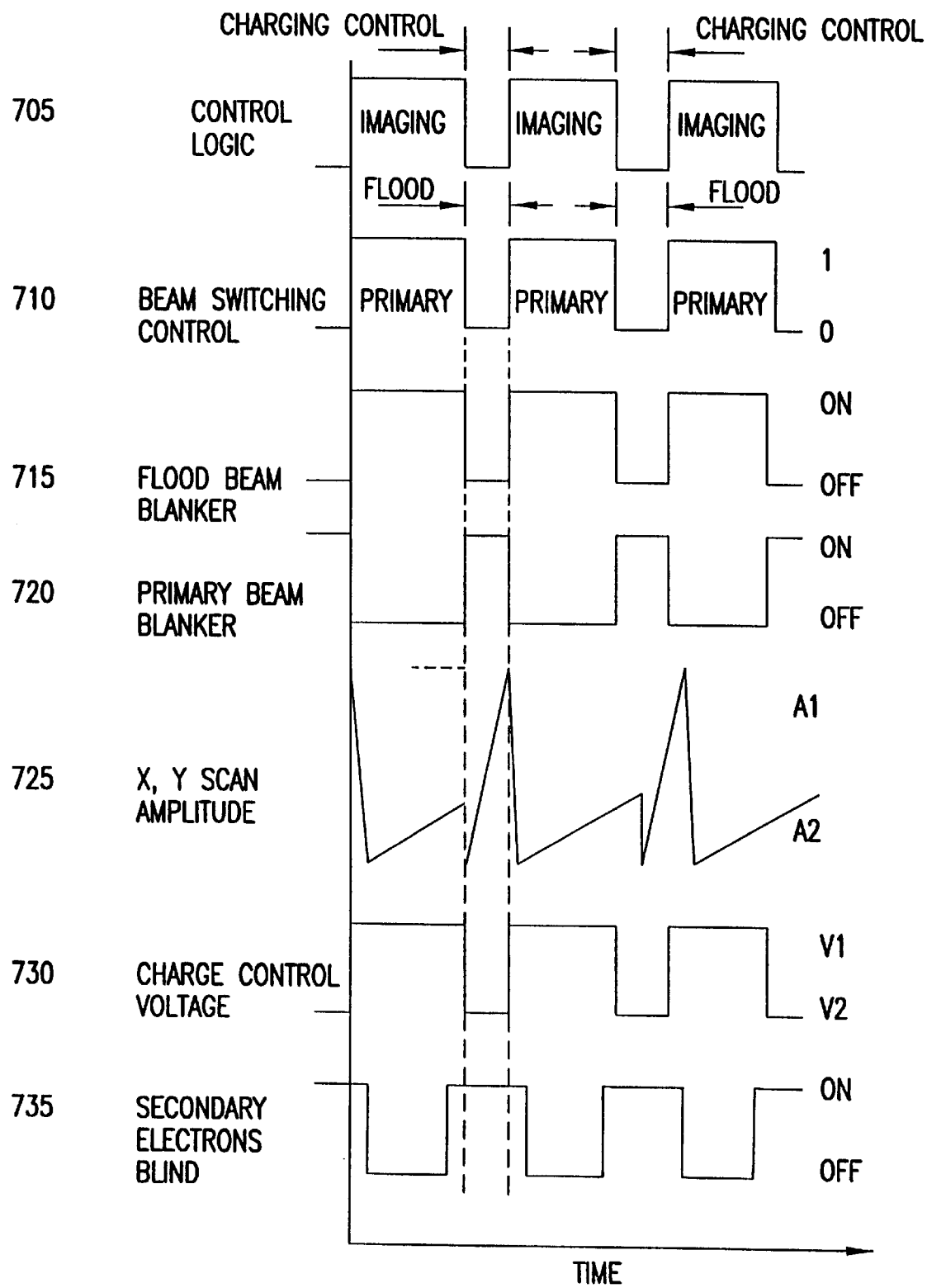
FIG. 7 is a system control timing diagram showing operating sequences of the system of FIG. 6.

FIG. 7 is a system control timing diagram showing operating sequences of the system of FIG. 6 including the in-column flood gun. The timing sequence is controlled by control logic programmed in a control system (such as control system 40 under control of computer 42, as shown in FIG. 1) to synchronize the primary beam for imaging (or partial imaging) with the flood beam for controlling charge on the wafer. That is, the control logic sequence as shown in line 705 alternates between imaging intervals in which the primary beam is to be scanned for imaging, and charging control intervals in which the flood beam is activated to control charge-up of the wafer surface. Line 710 shows a beam-switching control signal for alternating between the primary beam and the flood beam. During imaging intervals, the flood beam blanker is switched on (see line 715) while the blanker of primary-beam gun 605 and the flood-beam-bending lens 622 and the secondary-electron blind 640 are switched off (see lines 720 and 730), so that primary beam 670 is directed to wafer 660 and secondary electrons can reach detector 630. Also during imaging intervals, raster-scanning coils 625 and charging-control electrode 650 are set to their programmed values as desired for imaging (see lines 725 and 730).

During charging control intervals, the flood-beam-bending lens 622 and the blanker of primary-beam gun 605 are switched on (see line 720) while the flood-beam blanker is switched off (see line 715) so that the flood beam is selected for operation. Also during charging control intervals, the secondary electron blind 640 is switched on (see line 735) to prevent secondary electrons from overwhelming detector 630, and raster-scanning coils 625 and charging control electrode 650 are set to their programmed values as desired for flooding (see lines 725 and 730). It is assumed in the example of FIGS. 6 and 7 that the same raster-scanning coils are shared by the primary beam and the flooding beam, though separate coils may be provided if desired. It is also assumed that the duty cycles of primary beam 670 and flood beam 675 (see line 710) are not necessarily the same because the beams have very different currents and objectives. The raster-scanning amplitude also can differ between imaging and flooding intervals to provide flexibility for different area coverage during imaging than during flooding.

Figure 8:
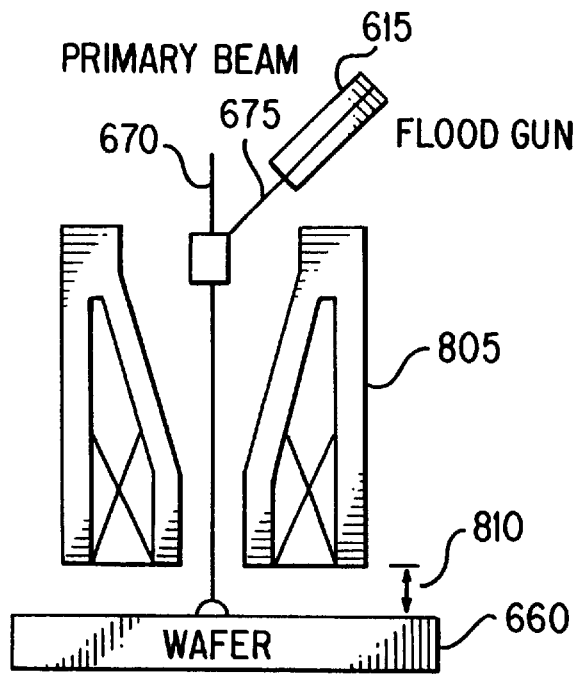
FIG. 8 is a schematic sectional view of a system having a flood gun in the column in accordance with the invention.

FIG. 8 is a schematic sectional view showing of a system having a flood gun in the column in accordance with the invention. The electron column (such as column 610 of FIG. 6 and column 20 of FIG. 1) includes an objective lens 805 through which the primary beam and the flood beam are alternately directed as described above. The in-the-column flood gun design offers a number of advantages. Among these are the ability of the primary beam to operate at a short working distance 810 and to share a common "field of view" with the flood beam.

Figure 9:
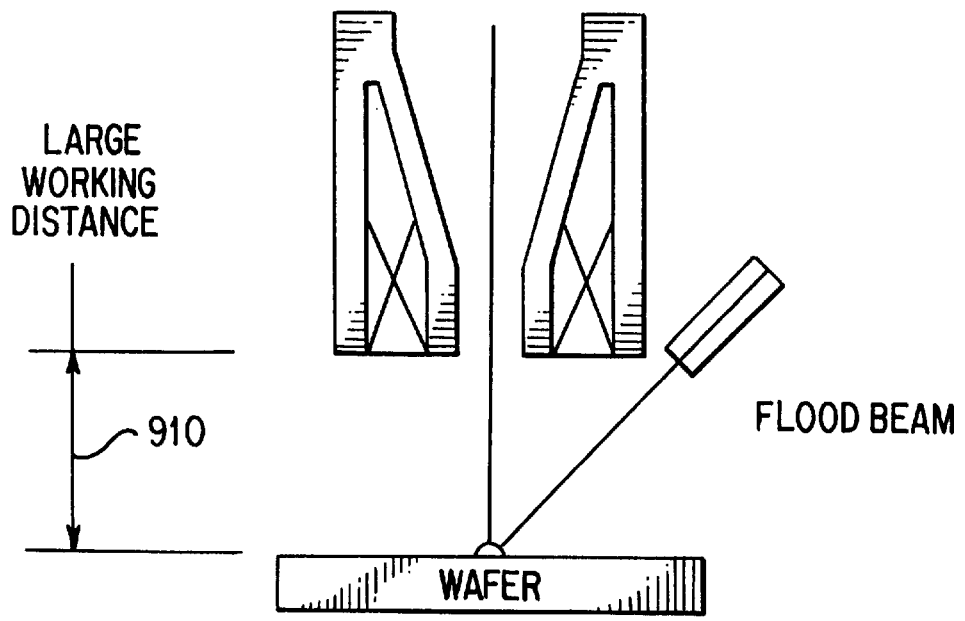
FIGS. 9 and 10 are schematic section views of system not having a flood gun in the column.
Figure 10:
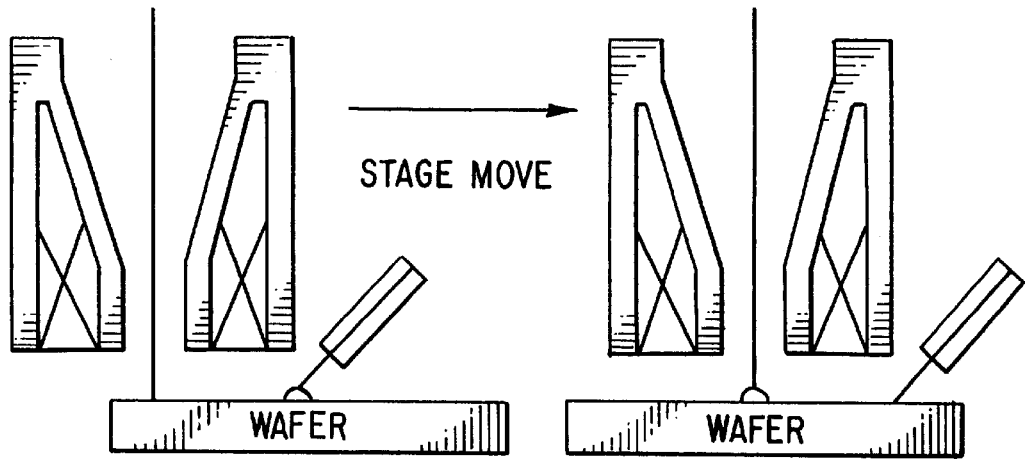

FIGS. 9 and 10 are schematic section views of system not having a flood gun in the column. Prior-art arrangements for other uses have the flood gun side-by-side with and outside of the column. In these arrangements, the flood gun beam does share the beam optics of the column or share a segment of optical axis with the primary beam. For arrangements having a flood gun adjacent the column, the column has to be spaced from the wafer at a large working distance 910 (see FIG. 9), or the stage has to move the column between a first position where the flood beam can reach the wafer (see left side of FIG. 10) and a second position where the image beam can reach the wafer (see right side of FIG. 10). If the working distance is large as in FIG. 9, image resolution is degraded. If the stage must move as in FIG. 10, the time overhead associated with flooding the wafer is high; stage moves are typically between 600 ms and 2 sec, an order of magnitude greater than the typical imaging time.

Figure 11:
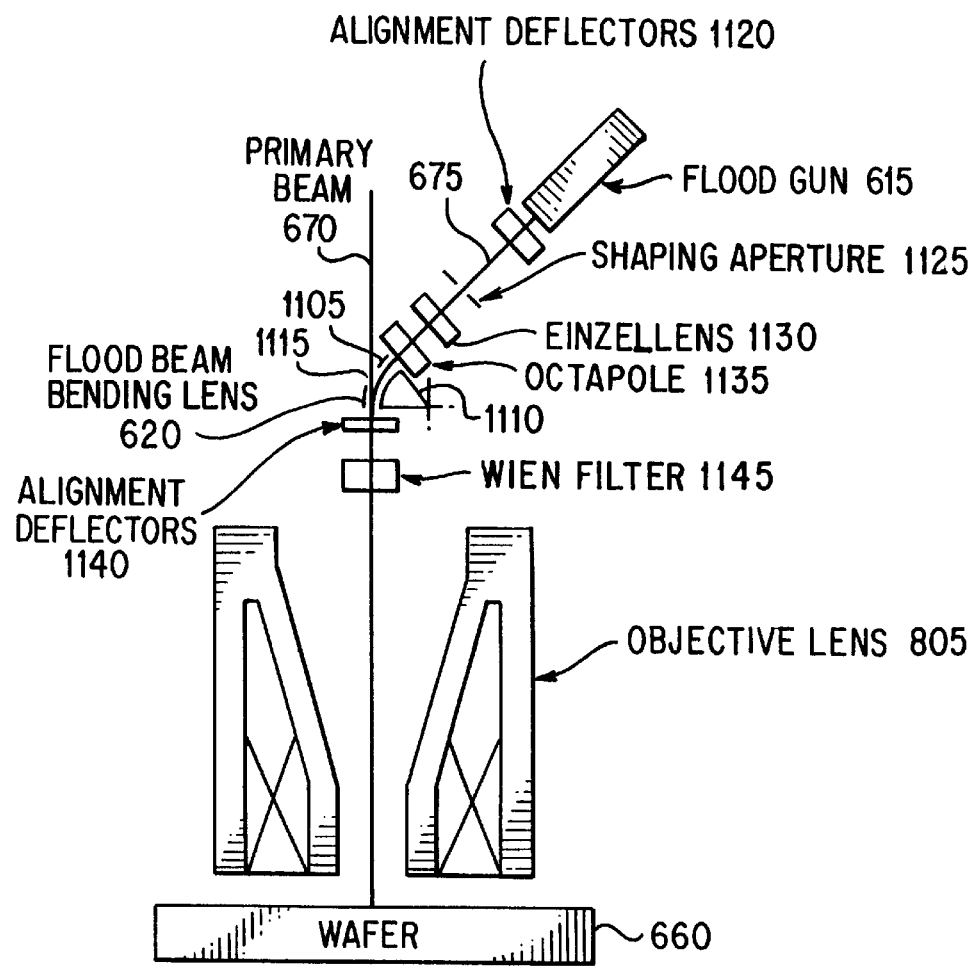
FIG. 11 is a schematic sectional view of a system having a flood gun in the column and a flood-beam-bending lens in accordance with the invention.
Figure 12:
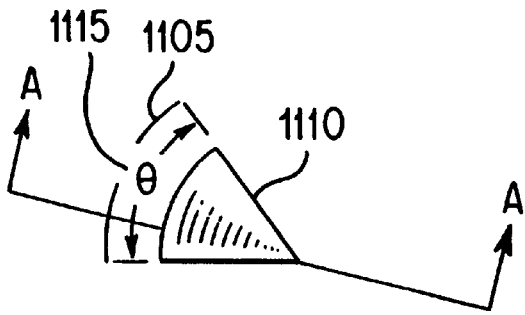
FIG. 12 is a sectional view of a flood-beam-bending lens in accordance with the invention.
Figure 13:
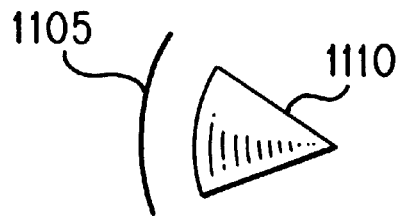
FIG. 13 is a view taken along line A—A of FIG. 12 showing a spherical-electrode flood-beam-bending lens in accordance with the invention.

FIG. 11 is a schematic sectional view of a system having a flood gun in the column and a flood-beam-bending lens in accordance with the invention. FIG. 11 is a view in the flood-beam-trajectory plane in which elements of the flood-beam optics are shown. In a preferred embodiment, the flood beam bending lens comprises a pair of concentric partial spherical electrodes 1105 and 1110 which serve to bend and to switch flood beam 675. FIG. 12 is a sectional view of electrodes 1105 and 1110 in the flood-beam-trajectory plane; FIG. 13 is a view taken along line A—A of FIG. 12. To select the flood beam for operation, a potential is applied across electrodes 1105 and 1110. To select primary beam 670, electrodes 1105 and 1110 are grounded so that primary beam 670 can travel through an opening 1115 in electrode 1105 unaffected. As shown in FIG. 11, flood beam 675 from flood gun 615 passes through alignment deflectors 1120, through an optional shaping aperture 1125, through an Einzel lens 1130 and through an octapole 1135 to bending lens 622. when appropriate voltage is applied across electrodes 1105 and 1110 of bending lens 622, flood beam 675 is bent to the column axis and passes through alignment deflectors 1140, through Wien filter 1145 and through objective lens 805 to flood a region on the surface of wafer 660.

Bending lens 622 simultaneously deflects and focuses flood beam 675. The bending angle of the lens is determined by the angle (theta in FIG. 12) of the electrodes 1105 and 1110. In order to bend flood beam 675 to the column axis, the applied voltage is adjusted for the energy level of the flood-beam's electrons. The applied voltage is estimated to be around tens to hundreds of volts.

Figure 16:
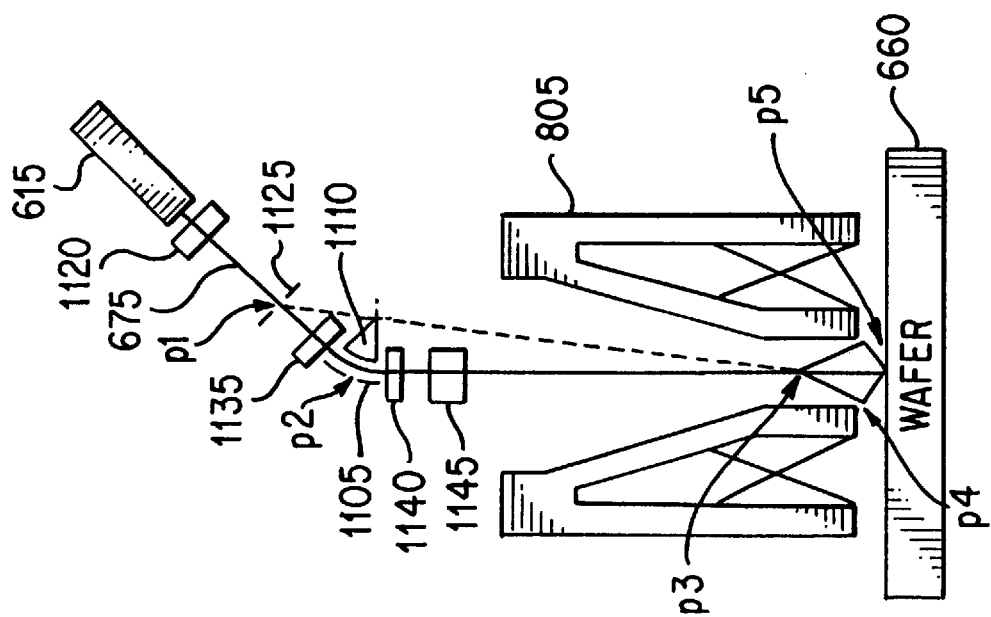
FIG. 16 is a schematic sectional view of the system of FIG. 11 with the flood optics set for high magnification to produce a large flood spot.
Figure 15:
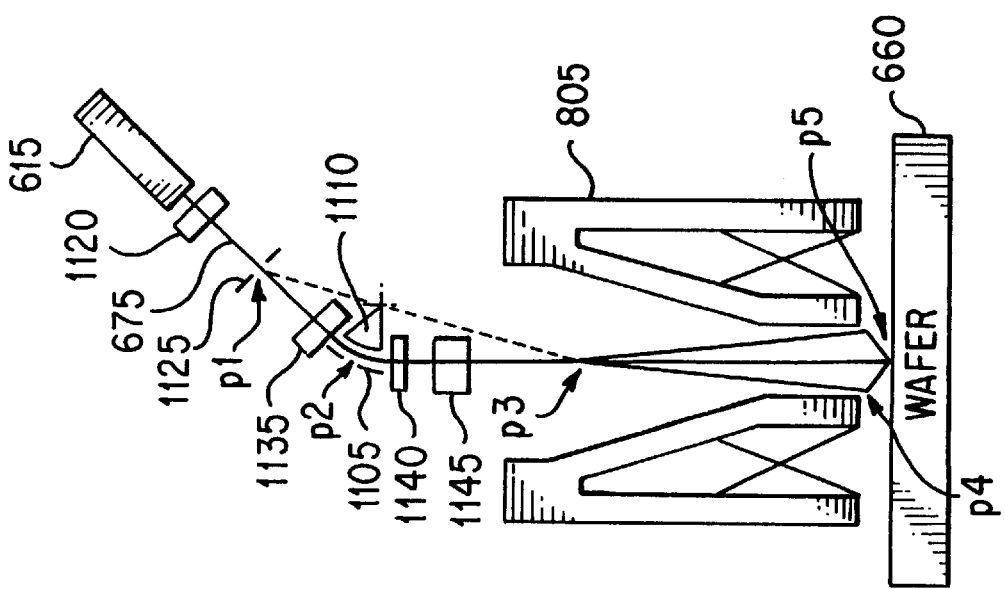
FIG. 15 is a schematic sectional view of the system of FIG. 11 with the flood optics set for low magnification to produce a small flood spot.

Focusing is illustrated in FIGS. 15 and 16. FIG. 15 shows the condition of low magnification and a small flood beam spot at the wafer. FIG. 16 shows the condition of high magnification and a large flood beam spot at the wafer. To determine where the image (cross-over at position p3 in FIGS. 15 and 16) of the bending lens is formed, the object (cross-over at position p1 formed by the flood gun 615) of the bending lens is moved away from electrodes 1105 and 1110 as in FIG. 15 or toward electrodes 1105 and 1110 as in FIG. 16. The location of the object cross-over (position p1) relative to flood gun 615 is determined by the focusing of flood gun 615, which is in turn controlled by the potential applied to focusing electrodes (not illustrated) within flood gun 615. The flood gun cross-over (position p1) is focused and "routed" to position p3 by bending lens 622. Magnification of bending lens 622 can be estimated by the ratio of the image distance (distance from p2 to p3) to the object distance (distance from p1 to p2). Weakening the flood-gun focusing as in FIG. 16 results in a higher magnification by bending lens 622 because the distance between p1 and p2 is shortened while the distance between p2 and p3 is lengthened. Similarly, weakening the flood-gun focusing also results in higher objective-lens magnification since the distance between p3 and p4 is shortened while the distance between p4 and p5 remains almost unchanged.

Figure 17:
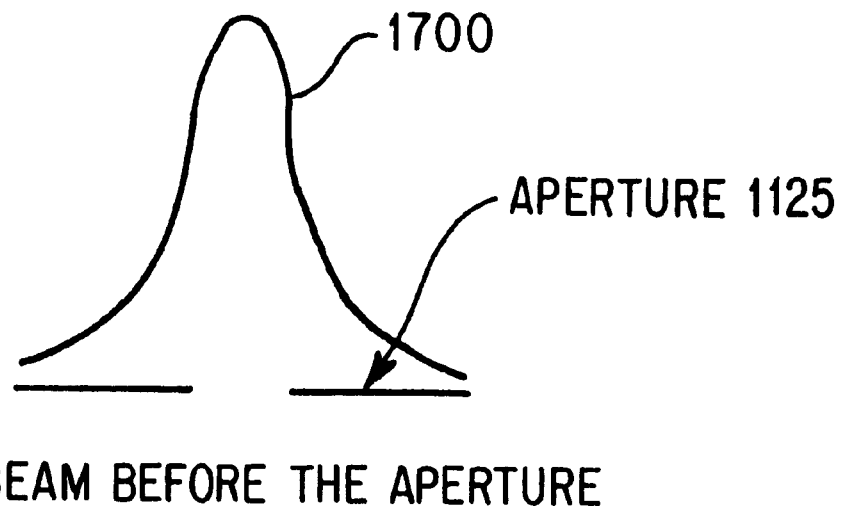
FIG. 17 illustrates the shape of a flood beam before passing through an aperture in accordance with the invention.
Figure 18:
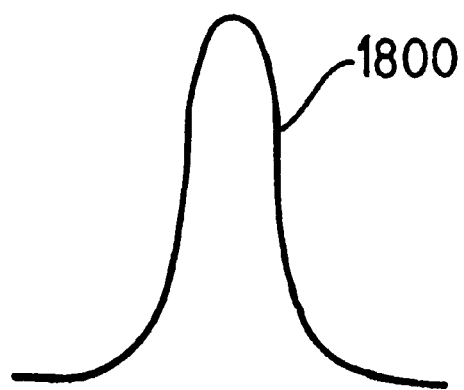
FIG. 18 illustrates the shape of a flood beam after passing through an aperture in accordance with the invention.

Thus, the flood-beam spot at the wafer can be controlled by adjusting the flood-gun focusing. Weakening the gun focusing results in a higher total magnification, therefore, a larger flood-beam spot. If a fine flood-beam edge definition is desired, an optional shaping aperture 1125 can be inserted at the gun cross-over. FIG. 17 shows the shape 1700 of a flood beam before passing through a shaping aperture 1125 as a distribution of electrons across the beam width. FIG. 18 shows the shape 1800 of the flood beam after passing through shaping aperture 1125, also as a distribution of electrons across the beam width. Some of the components shown in FIG. 11 are adopted to compensate imperfections of machining and assembly. Alignment deflectors 1120 can be used to align the flood beam to the optional shaping aperture 1125 or to the bending lens 622. Octapoles 1135 serve to correct astigmatism and can also be used for beam alignment to the bending lens 622. Alignment deflectors 1140 serve to align the flood beam to the objective lens 805.

Figure 14:
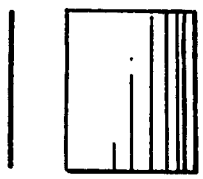
FIG. 14 is a view taken along line A—A of FIG. 13 showing a cylindrical-electrode flood-beam-bending lens in accordance with the invention.

Other configurations for the electrodes of the flood-beam bending lens 622 are also possible. For example, the electrode pair can be of concentric partial cylindrical shape rather than the concentric partial spherical shape described above. The cross section of the cylindrical design in the flood-beam-trajectory plane is the same as that for the spherical electrode design and is therefore identical to the illustration of FIG. 12. The optics are also identical in the flood-beam-trajectory plane for the two designs. FIG. 14 is a view taken along line A—A of FIG. 12 showing the cylindrical-electrode flood-beam-bending lens in a plane orthogonal to the flood-beam trajectory plane. In the plane orthogonal to the flood-beam trajectory plane, the flood beam is deflected and focused by the spherical electrodes, but is only deflected by the cylindrical electrodes. The result is that a flood beam of elongated cross-section is produced when the cylindrical electrode design is used. In this case, the flood beam can be raster-scanned to achieve uniform flood coverage at the wafer surface.

The flood-gun spot size and beam current parameters discussed above are suitable for many situations encountered in examining wafers. However, other applications can benefit from high-current flooding. Thus, one embodiment for the flood gun design is to adopt an extremely high current electron gun to produce flood current in the range of several hundred micro-amps. A high-beam-current flood gun such as Kimball Physics EFG-8 or FRA-2x 1–2, which can deliver ~400 micro-amps with 2.5 mm spot, is ideal for this application. A focusing lens (e.g. Einzel lens 1130) can be used to de-magnify the spot from the gun to produce a sub-millimeter cross-over spot before the beam enters the beam-bending electrodes of lens 622.

Figure 19:
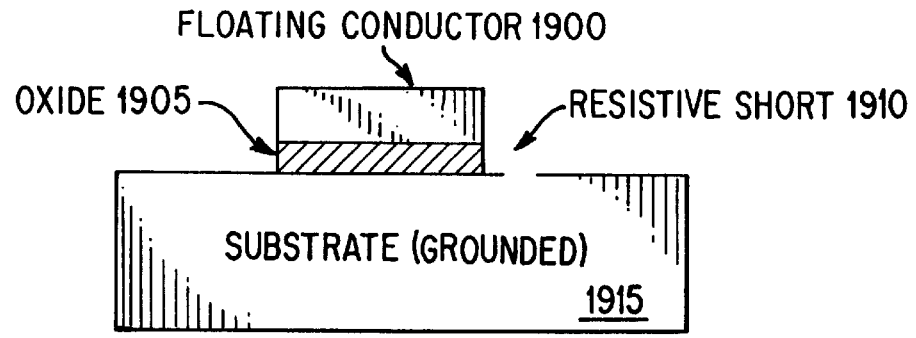
FIG. 19 is a cross-sectional view of a portion of a wafer having a resistive short from a conductor to the substrate.

This high-current design facilitates detection of defects which are otherwise difficult to detect, such as a low-resistive short (resistance as low as tens of kilohms) due to metal stringer or contaminants bridging. FIG. 19 shows an example in cross-sectional view of a portion of a wafer having a resistive short from a conductor to the substrate. Detecting these hard-to-find defects is important because they have become increasingly common in advanced-device fabrication (0.35 micron technology and beyond). Such defects are so small that they are undetectable by optical microscope. They could be seen under a charged-particle microscope but are extremely difficult to be isolated because the microscope has a very small field of view when operating at high magnification. A voltage-contrast charged-particle beam system, on the other hand, does not suffer these shortcomings because it is designed to spot the consequence of the defects rather than the nano-scopic defect itself, voltage contrast changes on a microscopic circuit due to nano-scopic defects can be easily detected in this case. In order for a voltage-contrast system to detect these defects, the system must be able to charge up the conductor to establish voltage contrast between floating and grounded conductors.

Employing a flood gun which can deliver hundreds of micro-amps allows the detection of resistive shorts as low as several tens of kilohms.

Figure 20:
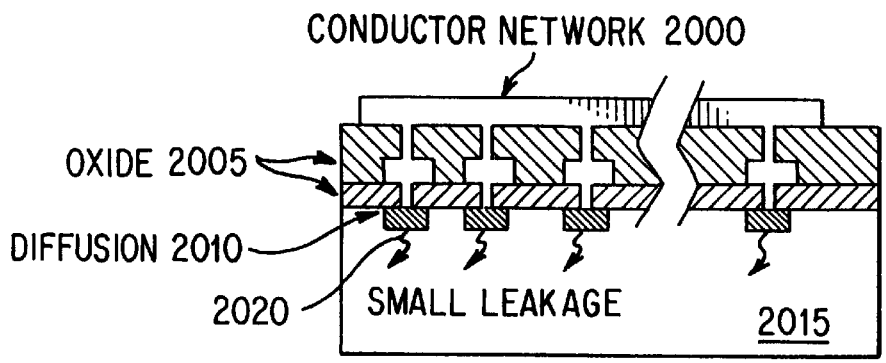
FIG. 20 is a cross-sectional view of a portion of a wafer having a large network of conductors with electrical leakage.

Another reason for using such a high-current flood gun is to detect shorts on large floating-conductor networks, for instance, SRAM memory networks. FIG. 20 is a cross-sectional view of a portion of a wafer having a large network of conductors with electrical leakage. In this case, the small leakage from each cell results in a cumulative leakage from the network which is so great that a high-current flood gun is needed to charge up the network.

Figure 21:
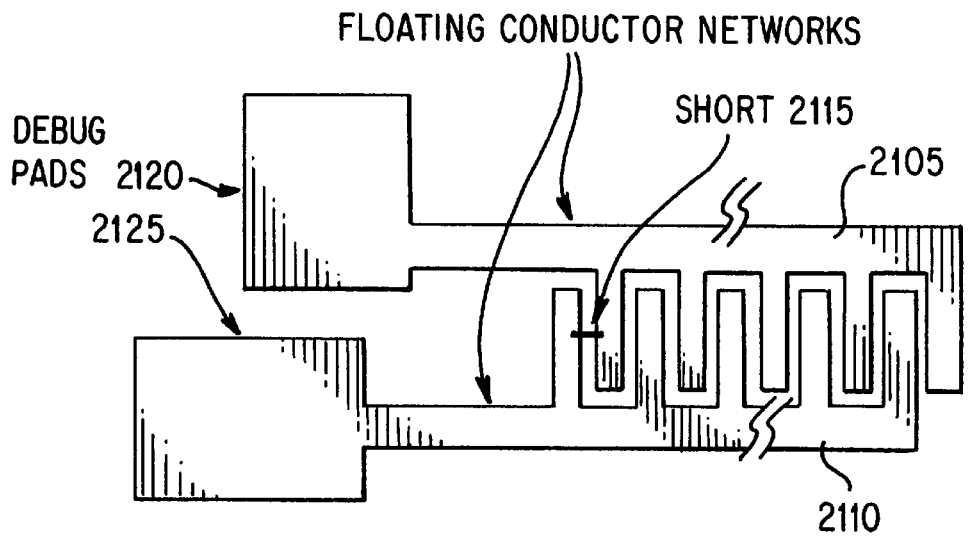
FIG. 21 is a cross-sectional view of a portion of a wafer having a short between multiple floating-conductor networks.

The high current flood gun design also make possible the detection of perhaps the most challenging of defects: bridging between two large floating conductor networks such as netowrks 2105 and 2110 of FIG. 21. To detect this type of defect, conductor pads such as shown at 2120 and 2125 can be designed into each network for debugging purposes. The conductor pads can be microns to tens of microns each side if they are square. To test the circuit, one of the networks is first charged up by flooding the debug pad for that network. For example network 2105 is charged up by flooding debug pad 2120. The system then employs the primary beam to interrogate the voltage contrast of the other network 2110. A short is present between the two networks if the second network 2120 is found charged. The alternative techniques are by dropping a mechanical probe or a probe card to the debug pad and raising the conductor voltage with an external voltage source instead of charging with a flood gun. These techniques, however, have the drawbacks of low throughput due to mechanical positioning and alignment and particle contamination due to mechanical contacts.

The invention has been described above as using an electron flood gun and an electron beam prober. Other charged particle techniques can be used in place of the electron beam techniques, for example focused ion beam techniques, or mechanical, optical or atomic force probes might also be useful. Other means for applying charge might include direct electrical contact or electric field approaches.

We claim:

1. A method of detecting electrical defects in a die on a semiconductor wafer, comprising:

a) applying charge to a predetermined region of the wafer such that electrically isolated structures in the predetermined region are raised to a voltage relative to electrically grounded structures;

b) probing a portion of the predetermined region so as to obtain voltage contrast data for the structures in the portion of the predetermined region; and c) analyzing the voltage contrast data to detect structures at voltages different from reference voltages that would be anticipated for such structures if such a charge were applied and the structures were non-defective, thereby identifying defective structures;

wherein the step of applying the charge is performed so as to apply charge to the predetermined region at a significantly lower resolution than the resolution at which the region is probed.

2. A method as claimed in claim 1, wherein step a) comprises flooding the predetermined region with relatively low energy electrons.

3. A method as claimed in claim 2 wherein the flooding step applies electrons to at least a major part of the predetermined region in a single step.

4. A method as claimed in claim 1, wherein step b) comprises scanning a charged particle beam across the predetermined region in a series of scan lines which intersect the structures.

5. A method as claimed in claim 4, wherein the charged particle beam scans substantially less than the whole area of the predetermined region.

6. A method as claimed in claim 1, wherein step b) comprises obtaining a voltage contrast image of the portion of the region.

7. A method as claimed in claim 6, wherein step c) comprises comparing the voltage contrast image to an image of corresponding structures at the reference voltages.

8. A method as claimed in claim 6, wherein step c) comprises comparing the voltage contrast image with an image of corresponding structures elsewhere on the wafer and determining any differences between the images.

9. A method as claimed in claim 1, wherein the reference voltages are derived from design data for the die and step c) comprises comparing the voltage contrast data with the reference voltages.

10. A method as claimed in claim 1, wherein step c) comprises analysis of the voltage contrast data to determine the presence of a defect selected from the group consisting of shorts, gate shorts, open vias, broken conductor lines, bridging conductors and missing diffusion.

11. A method as claimed in claim 1, further comprising optically inspecting the wafer for defects and comparing the defects detected by such inspection with defects detected by analysis of the voltage contrast data.

12. A method as claimed in claim 11, further comprising determining which defects detected by optical inspection have no electrical effect on the structures by comparison with the voltage contrast data.

13. A method as claimed in claim 1, comprising repetitions of steps a)–c) separated by manufacturing process steps applied to the wafer.

14. A method as claimed in claim 1, wherein the predetermined region to which the charge is applied includes a conductor which has an unwanted resistive short to another portion of the die, and wherein the amount of charge applied is sufficient to charge up said conductor to establish voltage contrast between floating and grounded conductors.

15. A method as claimed in claim 1, wherein the predetermined region to which the charge is applied includes a large floating-conductor network, and wherein the amount of charge applied is sufficient to charge the network to establish voltage contrast between the network and surrounding structure of the die.

16. A method as claimed in claim 1, wherein the die comprises a plurality of large networks, wherein the predetermined region to which the charge is applied comprises a portion of a first one of the networks, and wherein analyzing the voltage contrast data comprises determining whether charge is detectable on a second on e of the networks.

17. Apparatus for detecting electrical defects in a die on a semiconductor wafer, comprising:

a) means for applying charge to a predetermined region of the wafer such that electrically isolated structures in the die are raised to a voltage relative to electrically grounded structures;

b) a probe, having significantly higher resolution than the means for applying charge, for obtaining voltage contrast data for a portion of the predetermined region containing such structures;

c) means for determining reference voltages for such structures, should they be so charged and should they be non-defective;

d) means for analyzing the voltage contrast data to detect structures at voltages different from the reference voltages for such structures, thus determining which structures are defective.

18. Apparatus as claimed in claim 17, wherein the means for analyzing voltage contrast data compares the voltage contrast data taken from the portion of the predetermined region with voltage contrast data obtained from a corresponding region of another device.

19. Apparatus as claimed in claim 17, wherein the means for determining reference voltages comprises means for using design data for the die to determine the reference voltages and means for analyzing the voltage contrast data comprises means for comparing the voltage contrast data with the design data reference voltages.

20. Apparatus as claimed in claim 17, wherein the probe comprises an electron beam probe arrangement which scans an electron beam across the die.

21. Apparatus as claimed in claim 20, wherein the electron beam probe also includes a detector for secondary electrons emitted from the die as the electron beam is scanned across the die.

22. Apparatus as claimed in claims 20, wherein the electron beam probe scans the beam across substantially less than the whole area of the predetermined region.

23. Apparatus as claimed in claim 17, wherein the means for applying the charge to the wafer comprises a charged particle flood gun.

24. Apparatus as claimed in claim 23, wherein the charged particle flood gun applies relatively low energy electrons to the wafer.

25. Apparatus as claimed in claim 23, wherein the probe comprises a charged-particle-beam column having a column axis and an objective lens, and wherein the charged particle flood gun is positioned within the column so that the flood beam is parallel to the column axis when the flood beam exits the objective lens.

26. Apparatus as claimed in claim 25, further comprising a controllable deflector for selecting whether the primary beam or the flood beam is applied to the wafer.

27. Apparatus as claimed in claim 25, wherein the column comprises a set of raster-scanning coils for for scanning the flood beam over a region of wafer significantly larger than the flood-beam spot for scanning the primary beam over a region of the wafer larger than the primary-beam spot.

28. A method of detecting electrical defects in a device on a semiconductor wafer, the device having some structures at ground voltage and other structures at a floating voltage relative to ground, the method comprising:

a) scanning a charged particle beam across the surface of a predetermined region of the device in a series of spaced scan lines so as to intersect the structures;

b) obtaining voltage contrast data for each scan line in the series;

c) analyzing the voltage contrast data from the scan lines to determine the presence of a structure at a different voltage from a reference voltage anticipated for that structure if that structure were so charged and non-defective, thus identifying defective structures.

29. A method as claimed in claim 28, wherein the charged particle beam comprises an electron beam which is scanned at a substantially greater resolution along the scan lines compared to the spacing of the scan lines.

30. A method as claimed in claim 29, wherein the electron beam is scanned so as to cover less than 50% of the predetermined region.

31. A method as claimed in claim 29, wherein the spacing of the scan lines is selected so as to ensure that substantially all of the structures are intersected by the scan lines.

32. A method as claimed in claim 28, comprising comparing the voltage contrast data for a scan line with that obtained for a corresponding line on another device on the wafer.

33. Apparatus for detecting electrical defects in a device on a semiconductor wafer, having some structures at ground voltage and other structures at a floating voltage relative to grounds comprising:

a) a charged particle beam probe for scanning a charged particle beam across a predetermined region of a surface of the device in a series of spaced scan lines so as to intersect structures in the device;

b) a secondary particle detector for obtaining voltage contrast data for the scan lines;

c) means for analyzing the voltage contrast data to determine the presence of a structure at a different voltage from a reference voltage for that structure should the structure be so charged and non-defective, thus identifying defective structures.

34. Apparatus as claimed in claim 33, wherein the charged particle beam probe comprises an electron beam which is scanned at a substantially greater resolution along the scan lines compared to the spacing of the scan lines.

35. Apparatus as claimed in claim 34, wherein the probe scans the electron beam over less than 50% of the predetermined region.

36. Apparatus as claimed in claim 33, wherein the means for analyzing the voltage contrast data comprises means for comparing the data with corresponding data obtained from another device so as to determine any difference there between.

37. Apparatus as claimed in claim 33, further comprising a stage for the wafer which is capable of moving the wafer relative to the electron beam probe.

38. Apparatus as claimed in claim 37, wherein the column comprises electrostatic deflectors for scanning the flood beam over a region of the wafer significantly larger than the flood-beam spot.

39. Apparatus as claimed in claim 37, wherein the flood gun is capable of delivering a flood beam having a beam current of several hundreds of microphones.

40. Apparatus as claimed in claim 37, wherein the column comprises raster-scanning coils for scanning the flood beam over a region of the wafer significantly larger than the flood-beam spot.

41. Apparatus as claimed in claim 37, wherein the probe further comprises a primary-beam source, the apparatus further comprising beam-switching elements for alternately applying to the wafer a primary beam from the source and a flood beam from the flood gun, without changing working distance of the column relative to the wafer.

42. Apparatus as claimed in claim 41, wherein the deflector comprises a pair of substantially concentric partial spherical electrodes.

* * * * *